United States Patent
Mitani et al.

(10) Patent No.: US 9,214,362 B2
(45) Date of Patent: Dec. 15, 2015

(54) PRODUCING METHOD OF ENCAPSULATING LAYER-COVERED SEMICONDUCTOR ELEMENT AND PRODUCING METHOD OF SEMICONDUCTOR DEVICE

(71) Applicant: NITTO DENKO CORPORATION, Ibaraki-shi, Osaka (JP)

(72) Inventors: Munehisa Mitani, Osaka (JP); Yuki Ebe, Osaka (JP); Yasunari Ooyabu, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/412,746

(22) PCT Filed: Jul. 17, 2013

(86) PCT No.: PCT/JP2013/069373
§ 371 (c)(1),
(2) Date: Jan. 5, 2015

(87) PCT Pub. No.: WO2014/014007
PCT Pub. Date: Jan. 23, 2014

(65) Prior Publication Data
US 2015/0194324 A1    Jul. 9, 2015

(30) Foreign Application Priority Data
Jul. 17, 2012  (JP) ................. 2012-158945

(51) Int. Cl.
*H01L 21/00* (2006.01)
*H01L 21/56* (2006.01)
(Continued)

(52) U.S. Cl.
CPC ............ *H01L 21/563* (2013.01); *H01L 21/561* (2013.01); *H01L 21/568* (2013.01);
(Continued)

(58) Field of Classification Search
CPC ............... H01L 21/563; H01L 23/293; H01L 2933/005; H01L 33/56

USPC .................... 438/112, 127, 780, 781
See application file for complete search history.

(56) References Cited

U.S. PATENT DOCUMENTS 5,733,799 A *  3/1998  Teruyama ..................... 438/127
5,946,556 A *  8/1999  Hashizume .................. 438/126
(Continued)

FOREIGN PATENT DOCUMENTS

JP    2010-109383 A    5/2010
JP    2010-123802 A    6/2010
(Continued)

OTHER PUBLICATIONS

Notification of Reasons for Refusal of JP 2013-534090 dated Jul. 29, 2014.
(Continued)

*Primary Examiner* — S. V. Clark
(74) *Attorney, Agent, or Firm* — Sughrue Mion, PLLC

(57) ABSTRACT

A method for producing an encapsulating layer-covered semiconductor element includes a disposing step of disposing a semiconductor element on a support, an encapsulating step of embedding and encapsulating the semiconductor element by an encapsulating layer in an encapsulating sheet including a peeling layer and the encapsulating layer laminated below the peeling layer and made from a thermosetting resin before complete curing, and a heating step of heating and curing the encapsulating layer after the encapsulating step. The heating step includes a first heating step in which the encapsulating sheet is heated at a first temperature, while being mechanically pressurized toward the support and a second heating step in which the encapsulating sheet is heated at a second temperature that is higher than the first temperature after the first heating step.

6 Claims, 5 Drawing Sheets

(51) Int. Cl.
*H01L 33/54* (2010.01)
*H01L 23/29* (2006.01)
*H01L 33/56* (2010.01)

(52) U.S. Cl.
CPC ............ *H01L23/293* (2013.01); *H01L 23/295* (2013.01); *H01L 33/54* (2013.01); *H01L 33/56* (2013.01); *H01L 2924/0002* (2013.01); *H01L 2933/005* (2013.01)

(56) References Cited

U.S. PATENT DOCUMENTS

2002/0151114 A1* 10/2002 Kanetaka et al. ............ 438/127
2011/0287582 A1* 11/2011 Shimada et al. ............ 438/107
2011/0301276 A1   12/2011 Katayama et al.
2013/0105997 A1    5/2013 Matsuda et al.

FOREIGN PATENT DOCUMENTS

| | | |
|---|---|---|
| JP | 2011-049298 A | 3/2011 |
| JP | 2012-012563 A | 1/2012 |
| JP | 2013-095809 A | 5/2013 |

OTHER PUBLICATIONS

International Search Report of PCT/JP2013/069373 dated Oct. 15, 2013.

* cited by examiner

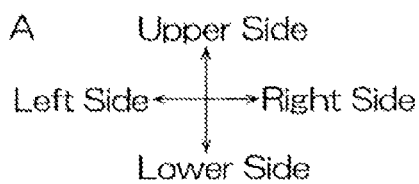
FIG. 1A
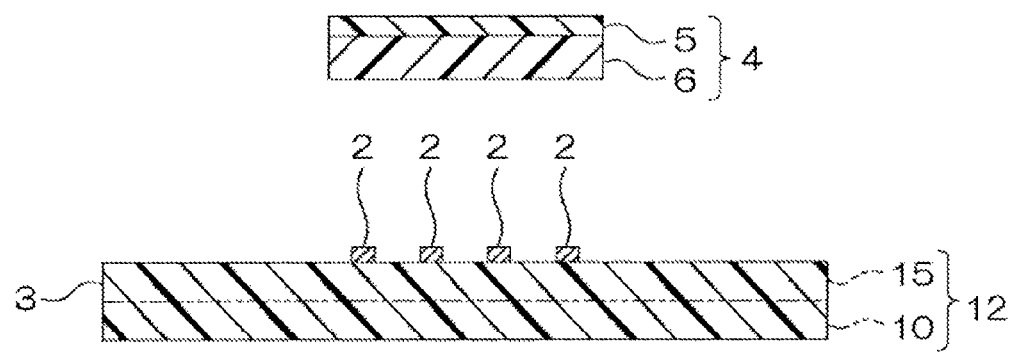
FIG. 1B
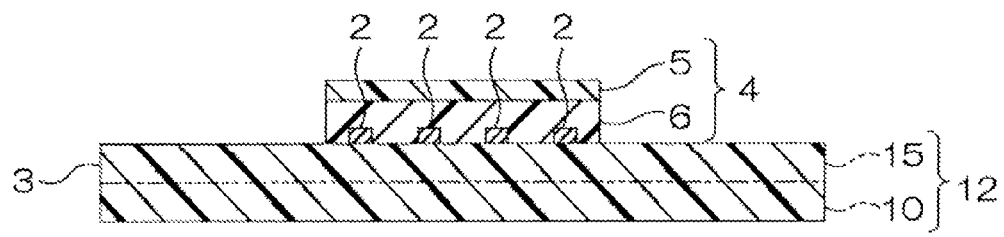

PRODUCING METHOD OF ENCAPSULATING LAYER-COVERED SEMICONDUCTOR ELEMENT AND PRODUCING METHOD OF SEMICONDUCTOR DEVICE

This is a National Stage of International Application No. PCT/JP2013/069373 filed Jul. 17, 2013, claiming priority based on Japanese Patent Application No. 2012-158945 filed Jul. 17, 2012, the contents of all of which are incorporated herein by reference in their entirety.

TECHNICAL FIELD

The present invention relates to a method for producing an encapsulating layer-covered semiconductor element and a method for producing a semiconductor device, to be specific, to a method for producing an encapsulating layer-covered semiconductor element and a method for producing a semiconductor device using the encapsulating layer-covered semiconductor element obtained by the method for producing an encapsulating layer-covered semiconductor element.

BACKGROUND ART

It has been conventionally known that a semiconductor element such as a light emitting diode is encapsulated by a resin.

A method for producing an optical semiconductor device has been proposed (ref: for example, the following Patent Document 1). In the method, for example, an encapsulating sheet having a substrate sheet and a silicone resin layer laminated below the substrate sheet is disposed on a board mounted with a light emitting diode and next, the light emitting diode is embedded and encapsulated by the silicone resin layer. Thereafter, the encapsulating sheet is heated at 120 to 250° C., the silicone resin layer (an encapsulating layer) is cured, and subsequently, the substrate sheet is peeled from the encapsulating layer to produce the optical semiconductor device.

PRIOR ART DOCUMENT

Patent Document

Patent Document 1: Japanese Unexamined Patent Publication No. 2013-095809

SUMMARY OF THE INVENTION

Problems to be Solved by the Invention

In the method described in Patent Document 1, however, there is a disadvantage that an encapsulating layer is deformed during heating. Also, there is a disadvantage that the substrate sheet is deformed during heating, so that along with the deformation of the substrate sheet, the encapsulating layer is further deformed.

It is an object of the present invention to provide a method for producing an encapsulating layer-covered semiconductor element and a method for producing a semiconductor device that are capable of preventing deformation of a peeling layer and suppressing deformation of an encapsulating layer.

Solution to the Problems

In order to achieve the above-described object, a method for producing an encapsulating layer-covered semiconductor element of the present invention includes a disposing step of disposing a semiconductor element on a support, an encapsulating step of embedding and encapsulating the semiconductor element by an encapsulating layer in an encapsulating sheet including a peeling layer and the encapsulating layer laminated below the peeling layer and made from a thermosetting resin before complete curing, and a heating step of heating and curing the encapsulating layer after the encapsulating step, wherein the heating step includes a first heating step in which the encapsulating sheet is heated at a first temperature, while being mechanically pressurized toward the support and a second heating step in which the encapsulating sheet is heated at a second temperature that is higher than the first temperature after the first heating step.

According to this method, in the first heating step, the encapsulating sheet is heated at the first temperature that is a relatively low temperature, so that the shape of the encapsulating layer is retained, while the encapsulating layer is in tight contact with the peeling layer and thus, the deformation of the encapsulating layer is capable of being suppressed.

Furthermore, in the first heating step, the encapsulating sheet is mechanically pressurized, so that the deformation of the peeling layer is capable of being prevented and accordingly, the deformation of the encapsulating layer conforming to the peeling layer is capable of being prevented.

Thereafter, in the second heating step, when the encapsulating sheet is heated at a second temperature that is a relatively high temperature, the encapsulating layer is capable of being surely completely cured, while the deformation of the encapsulating layer is suppressed.

In the method for producing an encapsulating layer-covered semiconductor element of the present invention, it is preferable that the encapsulating layer after the first heating step has a compressive elastic modulus at 23° C. of 1.20 MPa or more.

According to this method, the compressive elastic modulus at 23° C. of the encapsulating layer after the first heating step is 1.20 MPa or more, so that by the first heating step, the encapsulating layer is capable of being not easily deformed in the second heating step.

In the method for producing an encapsulating layer-covered semiconductor element of the present invention, it is preferable that the encapsulating layer in the encapsulating step is in a B-stage state of a two-step thermosetting resin composition.

According to this method, the encapsulating layer in the encapsulating step is in a B-stage state of the two-step thermosetting resin composition, so that in the encapsulating step, the shape of the encapsulating layer is capable of being surely retained. Thus, the semiconductor element is capable of being surely embedded and encapsulated, while the shape of the encapsulating layer is retained.

In the method for producing an encapsulating layer-covered semiconductor element of the present invention, it is preferable that the first temperature has a temperature rising range in which the temperature rises up to the second temperature.

According to this method, the production efficiency of the encapsulating layer-covered semiconductor element is capable of being improved, while the deformation of the encapsulating layer is suppressed.

In the method for producing an encapsulating layer-covered semiconductor element of the present invention, it is preferable that the support is a board and in the disposing step, the semiconductor element is mounted on the board.

According to this method, the deformation of the encapsulating layer is suppressed and the encapsulating layer that is completely cured is capable of being mounted on the board, so that the encapsulating layer-covered semiconductor element having excellent reliability is capable of being produced.

A method for producing a semiconductor device of the present invention includes the steps of producing an encapsulating layer-covered semiconductor element and mounting the encapsulating layer-covered semiconductor element on a board, wherein the encapsulating layer-covered semiconductor element is produced by the method for producing an encapsulating layer-covered semiconductor element including a disposing step of disposing a semiconductor element on a support, an encapsulating step of embedding and encapsulating the semiconductor element by an encapsulating layer in an encapsulating sheet including a peeling layer and the encapsulating layer laminated below the peeling layer and made from a thermosetting resin before complete curing, and a heating step of heating and curing the encapsulating layer after the encapsulating step, and the heating step includes a first heating step in which the encapsulating sheet is heated at a first temperature, while being mechanically pressurized toward the support and a second heating step in which the encapsulating sheet is heated at a second temperature that is higher than the first temperature after the first heating step.

According to this method, the encapsulating layer-covered semiconductor element including the encapsulating layer that is completely cured and in which the deformation thereof is suppressed is capable of being mounted on the board, so that the semiconductor device having excellent reliability is capable of being produced.

Effect of the Invention

According to the method for producing an encapsulating layer-covered semiconductor element of the present invention, the deformation of the encapsulating layer is capable of being suppressed.

In the method for producing a semiconductor device of the present invention, the encapsulating layer-covered semiconductor element including the encapsulating layer that is completely cured and in which the deformation thereof is suppressed is capable of being mounted on the board, so that the semiconductor device having excellent reliability is capable of being produced.

BRIEF DESCRIPTION OF THE DRAWINGS

FIGS. 1A and 1B show process drawings for producing a first embodiment of a method for producing a semiconductor device of the present invention:
FIG. 1A illustrating a disposing step and
FIG. 1B illustrating an encapsulating step.
FIG. 2A illustrating a heating step and
FIG. 2B illustrating a peeling step.
FIG. 3A illustrating an LED peeling step and
FIG. 3B illustrating a mounting step.
FIG. 4A illustrating a disposing step,
FIG. 4B illustrating a pressure-welding step, and
FIG. 4C illustrating a pressure exposed step.
FIG. 5A illustrating a heating step and
FIG. 5B illustrating a peeling step.

EMBODIMENT OF THE INVENTION

<First Embodiment>

Figure 2A:
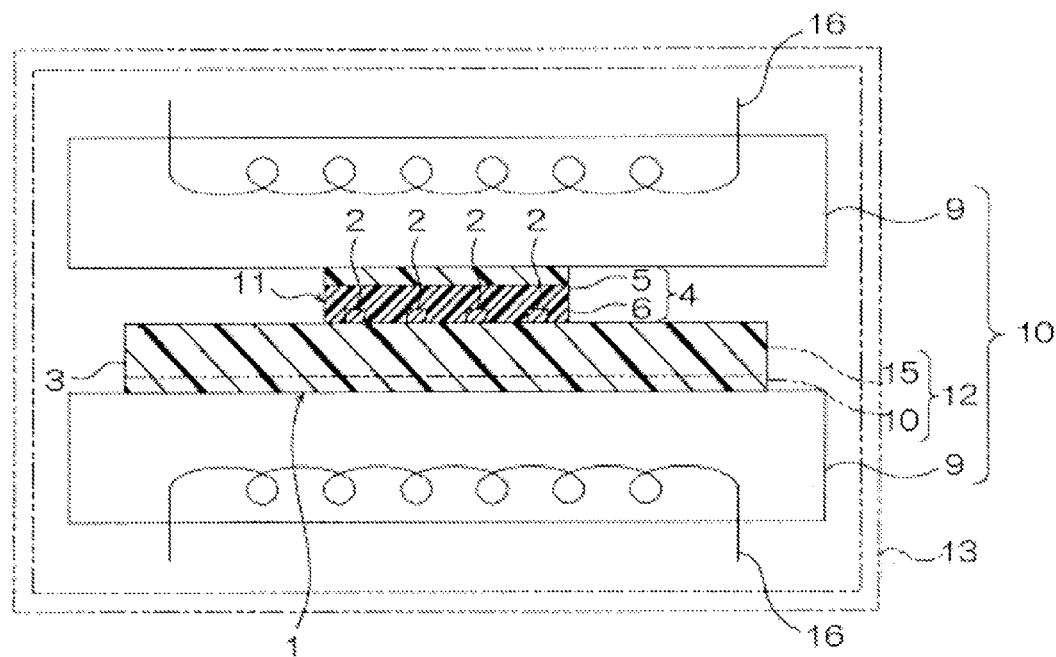
FIGS. 2A and 2B show process drawings for producing a first embodiment of a method for producing a semiconductor device of the present invention.
Figure 2B:
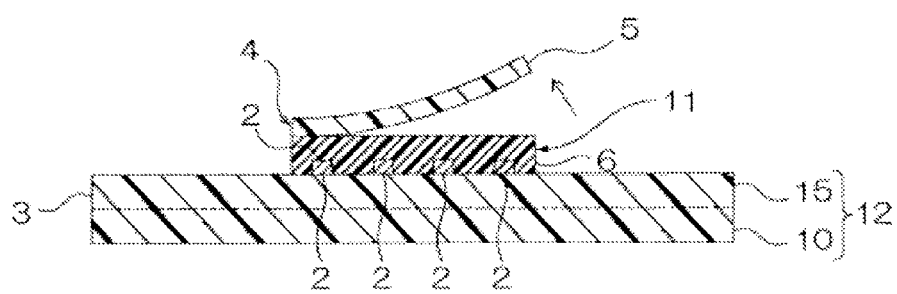

In FIGS. 1A and 1B, the upper side of the paper surface is referred to as an upper side (one side in a first direction, one side in a thickness direction); the lower side of the paper surface is referred to as a lower side (the other side in the first direction, the other side in the thickness direction); the left side of the paper surface is referred to as a left side (one side in a second direction perpendicular to the first direction); the right side of the paper surface is referred to as a right side (the other side in the second direction); the near side of the paper surface is referred to as a front side (one side in a third direction perpendicular to the first direction and the second direction); and the far side of the paper surface is referred to as a rear side (the other side in the third direction). To be specific, the directions described in FIGS. 1A and 1B are defined as a reference. Directions in figures subsequent to FIGS. 2A and 2B are in conformity with the directions in FIGS. 1A and 1B.

A method for producing an LED device 1 that is one embodiment of a method for producing an encapsulating layer-covered semiconductor element of the present invention includes a disposing step (ref: FIG. 1A), an encapsulating step (ref: FIG. 1B), and a heating step (ref: FIG. 2A). Hereinafter, each of the steps is described in detail.

[Disposing Step]

In the disposing step, LEDs 2, as semiconductor elements, are disposed on a board 3, as a support. To be specific, the LEDs 2 are mounted on the upper surface of the board 3.

As shown in FIG. 1A, the board 3 is formed into a flat plate shape in a generally rectangular shape in plane view extending in a plane direction (a front-rear direction and a right-left direction). The board 3 is formed of a material that is generally used in a board of the LED device 1, such as a metal material including aluminum, a ceramic material including alumina, and a resin material including polyimide. On the upper surface of the board 3, a conductive pattern (not shown) including an electrode (not shown) that is electrically connected to terminals (not shown) in the LEDs 2 and wires that are continuous to the electrode is formed. The conductive pattern is, for example, formed of a conductor such as gold, copper, silver, and nickel. The board 3 has a length of one side of, for example, 1 mm or more, and of, for example, 1000 mm or less. The board 3 has a thickness of, for example, 0.7 mm or more, or preferably 0.9 mm or more, and of, for example, 10 mm or less, or preferably 5 mm or less.

Each of the LEDs 2 is formed into a flat plate shape in a generally rectangular shape in plane view and is provided with a terminal (not shown) on the upper surface or the lower surface thereof. The LED 2 has a length of one side of, for example, 0.05 mm or more, or preferably 0.1 mm or more, and of, for example, 10 mm or less, or preferably 5 mm or less. The LED 2 has a thickness of, for example, 5 μm or more, or preferably 10 μm or more, and of, for example, 2000 μm or less, or preferably 1000 μm or less.

As a method for mounting the LEDs 2 on the board 3, for example, a flip-chip mounting is used. Or, the terminals in the LEDs 2 are also capable of being wire-bonding connected to the electrode in the board 3.

A plurality of the LEDs 2 are mounted on the board 3. The LEDs 2 are mounted on the upper surface of the board 3 at spaced intervals to each other in the plane direction. The LEDs 2 have a gap in the front-rear direction and the right-left direction of, for example, 0.1 mm or more, or preferably 1 mm or more, and of, for example, 50 mm or less, or preferably 5 mm or less.

[Encapsulating Step]

In the encapsulating step, as shown in FIG. 1A, first, an encapsulating sheet 4 is prepared and thereafter, as shown in FIG. 1B, the LEDs 2 are encapsulated by the encapsulating sheet 4.

As shown in FIG. 1A, the encapsulating sheet 4 includes a peeling layer 5 and an encapsulating layer 6 that is laminated below the peeling layer 5.

The peeling layer 5 is a layer that supports the encapsulating layer 6 in the encapsulating sheet 4 and that is peeled from the encapsulating layer 6 after its use. Examples of a material that forms the peeling layer 5 include a polymer film such as a polyethylene film and a polyester film (a PET film and the like), a ceramic sheet, and a metal foil. Preferably, a polymer film is used. The surfaces (the upper surface and the lower surface) of the peeling layer 5 can be also subjected to a release treatment such as a fluorine treatment. In the case of a polymer film, the peeling layer 5 has a linear expansion coefficient of, for example, $70 \times 10^{-6} K^{-1}$ or more, or preferably $80 \times 10^{-6} K^{-1}$ or more, and of, for example, $140 \times 10^{-6} K^{-1}$ or less, or preferably $120 \times 10^{-6} K^{-1}$ or less. The peeling layer 5 has a thickness of, for example, 25 μm or more, or preferably 38 μm or more, and of, for example, 2000 μm or less, or preferably 100 μm or less.

The encapsulating layer 6 is formed from an encapsulating resin composition containing an encapsulating resin into a sheet shape.

An example of the encapsulating resin includes a thermosetting resin that is cured by heating.

Examples of the thermosetting resin include a silicone resin, an epoxy resin, a polyimide resin, a phenol resin, a urea resin, a melamine resin, and an unsaturated polyester resin. Preferably, a silicone resin is used.

Examples of the thermosetting resin include a two-step thermosetting resin composition and a one-step thermosetting resin composition. Preferably, a two-step thermosetting resin composition is used.

The two-step thermosetting resin composition has a two-step reaction mechanism in which a resin composition is brought into a B-stage state (a semi-cured state) in the first-step reaction and is brought into a C-stage state (subjected to a final curing) in the second-step reaction. On the other hand, the one-step thermosetting resin composition has a one-step reaction mechanism in which a resin composition is completely cured in the first-step reaction. The B-stage state is a state between an A-stage state in which a thermosetting resin is in a liquid state and a C-stage state in which the thermosetting resin is completely cured. Also, the B-stage state is a state in which the curing and the gelation of the thermosetting resin are slightly progressed and in which the compressive elastic modulus thereof is smaller than that in a C-stage state.

An example of an uncured material (before the first-step curing) of the two-step thermosetting resin composition includes an uncured material of a two-step curable type silicone resin composition. Preferably, a condensation reaction and addition reaction curable type silicone resin composition is used.

The condensation reaction and addition reaction curable type silicone resin composition is a thermosetting silicone resin composition that is capable of undergoing a condensation reaction and an addition reaction by heating. To be more specific, the condensation reaction and addition reaction curable type silicone resin composition is a thermosetting silicone resin composition that is capable of undergoing a condensation reaction to be brought into a B-stage state (a semi-cured state) by heating and next, is capable of undergoing an addition reaction (to be specific, for example, a hydrosilylation reaction) to be brought into a C-stage state (a final curing state) by further heating.

Examples of the condensation reaction and addition reaction curable type silicone resin composition include a first condensation reaction and addition reaction curable type silicone resin composition that contains a polysiloxane containing silanol groups at both ends, an alkenyl group-containing trialkoxysilane, an organohydrogensiloxane, a condensation catalyst, and a hydrosilylation catalyst; a second condensation reaction and addition reaction curable type silicone resin composition that contains a polysiloxane containing silanol groups at both ends, an ethylenically unsaturated hydrocarbon group-containing silicon compound, an epoxy group-containing silicon compound, an organohydrogensiloxane, a condensation catalyst, and an addition catalyst; a third condensation reaction and addition reaction curable type silicone resin composition that contains a silicone oil containing silanol groups at both ends, an alkenyl group-containing dialkoxyalkylsilane, an organohydrogensiloxane, a condensation catalyst, and a hydrosilylation catalyst; a fourth condensation reaction and addition reaction curable type silicone resin composition that contains an organopolysiloxane having, in one molecule, at least two alkenylsilyl groups, an organopolysiloxane having, in one molecule, at least two hydrosilyl groups, a hydrosilylation catalyst, and a curing retarder; a fifth condensation reaction and addition reaction curable type silicone resin composition that contains a first organopolysiloxane having, in one molecule, both at least two ethylenically unsaturated hydrocarbon groups and at least two hydrosilyl groups, a second organopolysiloxane having, in one molecule, at least two hydrosilyl groups without containing an ethylenically unsaturated hydrocarbon group, a hydrosilylation catalyst, and a hydrosilylation retarder; a sixth condensation reaction and addition reaction curable type silicone resin composition that contains a first organopolysiloxane having, in one molecule, both at least two ethylenically unsaturated hydrocarbon groups and at least two silanol groups, a second organopolysiloxane having, in one molecule, at least two hydrosilyl groups without containing an ethylenically unsaturated hydrocarbon group, a hydrosilylation retarder, and a hydrosilylation catalyst; a seventh condensation reaction and addition reaction curable type silicone resin composition that contains a silicon compound, and a boron compound or an aluminum compound; and an eighth condensation reaction and addition reaction curable type silicone resin composition that contains a polyaluminosiloxane and a silane coupling agent.

These condensation reaction and addition reaction curable type silicone resin compositions can be used alone or in combination of two or more.

As the condensation reaction and addition reaction curable type silicone resin composition, preferably, a fourth condensation reaction and addition reaction curable type silicone resin composition is used.

The fourth condensation reaction and addition reaction curable type silicone resin composition is described in Japanese Unexamined Patent Publication No. 2011-219597 or the like and contains, for example, a dimethylvinylsilyl-terminated polydimethylsiloxane, a trimethylsilyl-terminated dimethylsiloxane-methylhydrosiloxane copolymer, a platinum-divinyltetramethyldisiloxane complex, and a tetramethylammonium hydroxide.

On the other hand, the one-step curable type silicone resin composition is a thermosetting silicone resin composition that has a one-step reaction mechanism and in which a silicone resin composition is subjected to a final curing in the first-step reaction.

An example of the one-step curable type silicone resin composition includes an addition reaction curable type silicone resin composition.

The addition reaction curable type silicone resin composition contains, for example, an ethylenically unsaturated hydrocarbon group-containing polysiloxane, which serves as a main agent, and an organohydrogensiloxane, which serves as a cross-linking agent.

Examples of the ethylenically unsaturated hydrocarbon group-containing polysiloxane include an alkenyl group-containing polydimethylsiloxane, an alkenyl group-containing polymethylphenylsiloxane, and an alkenyl group-containing polydiphenylsiloxane.

In the addition reaction curable type silicone resin composition, the ethylenically unsaturated hydrocarbon group-containing polysiloxane and the organohydrogensiloxane are usually provided in separate packages. To be specific, the addition reaction curable type silicone resin composition is provided as two liquids of A liquid that contains a main agent (the ethylenically unsaturated hydrocarbon group-containing polysiloxane) and B liquid that contains a cross-linking agent (the organohydrogensiloxane). A known catalyst that is necessary for the addition reaction of both components is added in the ethylenically unsaturated hydrocarbon group-containing polysiloxane.

In the addition reaction curable type silicone resin composition, the main agent (A liquid) and the cross-linking agent (B liquid) are mixed to prepare a liquid mixture. In a step of forming the liquid mixture into the above-described shape of the encapsulating layer 6, the ethylenically unsaturated hydrocarbon group-containing polysiloxane and the organohydrogensiloxane are subjected to an addition reaction and the addition reaction curable type silicone resin composition is cured, so that a silicone elastomer (a cured material) is formed.

The mixing ratio of the encapsulating resin with respect to 100 parts by mass of the encapsulating resin composition is, for example, 20 parts by mass or more, or preferably 50 parts by mass or more, and is, for example, 99.9 parts by mass or less, or preferably 99.5 parts by mass or less.

A phosphor and a filler can be also contained in the encapsulating resin composition as required.

An example of the phosphor includes a yellow phosphor that is capable of converting blue light into yellow light. An example of the phosphor includes a phosphor obtained by doping a metal atom such as cerium (Ce) or europium (Eu) into a composite metal oxide, a metal sulfide, or the like.

To be specific, examples of the phosphor include a garnet type phosphor having a garnet type crystal structure such as $Y_3Al_5O_{12}$:Ce (YAG (yttrium aluminum garnet):Ce), $(Y,Gd)_3Al_5O_{12}$:Ce, $Tb_3Al_3O_{12}$:Ce, $Ca_3Sc_2Si_3O_{12}$:Ce, and $Lu_2CaMg_2(Si,Ge)_3O_{12}$:Ce; a silicate phosphor such as $(Sr, Ba)_2SiO_4$:Eu, $Ca_3SiO_4Cl_2$:Eu, $Sr_3SiO_5$:Eu, $Li_2SrSiO_4$:Eu, and $Ca_3Si_2O_7$:Eu; an aluminate phosphor such as $CaAl_{12}O_{19}$:Mn and $SrAl_2O_4$:Eu; a sulfide phosphor such as ZnS:Cu,Al, CaS:Eu, $CaGa_2S_4$:Eu, and $SrGa_2S_4$:Eu; an oxynitride phosphor such as $CaSi_2O_2N_2$:Eu, $SrSi_2O_2N_2$:Eu, $BaSi_2O_2N_2$:Eu, and Ca-α-SiAlON; a nitride phosphor such as $CaAlSiN_3$:Eu and $CaSi_5N_8$:Eu; and a fluoride-based phosphor such as $K_2SiF_6$:Mn and $K_2TiF_6$:Mn. Preferably, a garnet type phosphor is used, or more preferably, $Y_3Al_5O_{12}$:Ce is used. These phosphors can be used alone or in combination of two or more.

Examples of a shape of the phosphor include a sphere shape, a plate shape, and a needle shape. Preferably, in view of fluidity, a sphere shape is used.

The phosphor has an average value of the maximum length (in the case of a sphere shape, the average particle size) of, for example, 0.1 μm or more, or preferably 1 μm or more, and of, for example, 200 μm or less, or preferably 100 μm or less.

The mixing ratio of the phosphor with respect to 100 parts by mass of the encapsulating resin composition is, for example, 0.1 parts by mass or more, or preferably 0.5 parts by mass or more, and is, for example, 80 parts by mass or less, or preferably 50 parts by mass or less.

Examples of the filler include silicone microparticles, glass, alumina, silica, titania, zirconia, talc, clay, and barium sulfate. These fillers can be used alone or in combination of two or more. Preferably, silicone microparticles and silica are used.

The mixing ratio of the filler with respect to 100 parts by mass of the encapsulating resin composition is, for example, 0.1 parts by mass or more, or preferably 0.5 parts by mass or more, and is, for example, 80 parts by mass or less, or preferably 50 parts by mass or less.

In addition, a known additive can be added to the encapsulating resin composition at an appropriate proportion. Examples of the known additive include modifiers, surfactants, dyes, pigments, discoloration inhibitors, and ultraviolet absorbers.

When the encapsulating layer 6 is a two-step thermosetting resin composition, the encapsulating layer 6 is prepared from a first-step cured material of the two-step thermosetting resin composition and when the encapsulating layer 6 is a one-step thermosetting resin composition, the encapsulating layer 6 is prepared from an uncured material (before curing) of the one-step thermosetting resin composition.

Particularly preferably, the encapsulating layer 6 is a first-step cured material of the two-step curable type silicone resin composition. That is, particularly preferably, the encapsulating layer 6 is in a B-stage state of the two-step thermosetting resin composition.

In order to form the encapsulating layer 6, for example, the above-described encapsulating resin composition (containing a phosphor, a filler, or the like as required) is applied onto the peeling layer 5 so as to have an appropriate thickness by, for example, an application method such as a casting, a spin coating, or a roll coating and the applied laminate is heated as required. In this way, the encapsulating layer 6 in a sheet shape is formed on the peeling layer 5.

The encapsulating layer 6 has a compressive elastic modulus at 23° C. of, for example, 0.15 MPa or less, preferably 0.12 MPa or less, or more preferably 0.1 MPa or less, and of, for example, 0.01 MPa or more, or preferably 0.04 MPa or more.

When the compressive elastic modulus of the encapsulating layer 6 is not more than the above-described upper limit, the flexibility of the encapsulating layer 6 can be secured. On the other hand, when the compressive elastic modulus of the encapsulating layer 6 is not less than the above-described lower limit, the shape retaining properties of the encapsulating layer 6 are ensured and the LEDs 2 can be embedded by the encapsulating layer 6.

As referred in FIG. 1A, the encapsulating layer 6 is formed into a generally rectangular sheet shape in plane view. The encapsulating layer 6 is adjusted to have a size that is capable of collectively encapsulating a plurality of the LEDs 2. The encapsulating layer 6 has a thickness of, for example, 100 μm or more, preferably 300 μm or more, or more preferably 400 μm or more, and of, for example, 2000 μm or less, or preferably 1000 μm or less.

In this way, the encapsulating sheet 4 including the peeling layer 5 and the encapsulating layer 6 is prepared.

Thereafter, as shown in FIG. 1B, the LEDs 2 are encapsulated by the encapsulating sheet 4. To be specific, the LEDs 2 are embedded and encapsulated by the encapsulating layer 6 in the encapsulating sheet 4.

To be specific, as shown in FIG. 1A, first, the encapsulating sheet 4 is disposed at the upper side of the board 3 so that the encapsulating layer 6 faces downwardly and next, as shown in FIG. 1B, the encapsulating layer 6 is pressure-welded to the board 3 with a pressing machine or the like.

Preferably, the encapsulating sheet 4 and the board 3 are disposed in opposed relation to each other and then, are put into a vacuum chamber such as a vacuum pressing machine. Next, the pressure in the vacuum chamber is reduced. To be specific, the pressure in the vacuum chamber is evacuated with a vacuum pump (a pressure-reducing pump) or the like. Thereafter, the inside of the vacuum chamber is brought into a reduced pressure atmosphere and the encapsulating layer 6 is pressure-welded to the board 3 with a pressing machine of the vacuum pressing machine or the like. The reduced pressure atmosphere is, for example, 300 Pa or less, preferably 100 Pa or less, or particularly preferably 50 Pa or less. Thereafter, the board 3 and the encapsulating layer 6 are exposed to an atmospheric pressure atmosphere.

The temperature in the encapsulating step is adjusted to be a temperature at which the encapsulating layer 6 is not completely cured, to be specific, a temperature at which a B-stage state is retained when the encapsulating layer 6 is in a B-stage state. The temperature in the encapsulating step is, for example, 0° C. or more, or preferably 15° C. or more, and is, for example, 40° C. or less, or preferably 35° C. or less. To be specific, the temperature in the encapsulating step is a normal temperature (to be specific, 20 to 25° C.).

In this way, the LEDs 2 are embedded and encapsulated at a normal temperature by the encapsulating layer 6.

That is, the upper surface and the side surfaces (the left surface, the right surface, the front surface, and the rear surface) of each of the LEDs 2 and the upper surface of the board 3 that is exposed from the LEDs 2 are covered with the encapsulating layer 6.

[Heating Step]

The heating step is a step of, after the encapsulating step, heating and curing the encapsulating layer 6. As shown in FIG. 2A, the heating step includes a first heating step in which the encapsulating sheet 4 is heated at a first temperature, while being mechanically pressurized toward the board 3 and a second heating step in which the encapsulating sheet 4 is heated at a second temperature that is higher than the first temperature after the first heating step. That is, the heating step is a two-step heating step in which the encapsulating sheet 4 is heated in two steps at different temperatures.

(First Heating Step)

In order to heat the encapsulating sheet 4 at the first temperature, while being mechanically pressurized toward the board 3, as shown by solid lines in FIG. 2A, for example, a heating-mechanically pressurizing device such as a hot-pressing device 10 including flat plates 9 each provided with a heater 16 (that is, a mechanically heating-mechanically pressurizing device 10) or a pressing device-including dryer 13 including the hot-pressing device 10 having the flat plates 9 (a phantom line, a fluid heating-mechanically pressurizing device 13) is used. Unlike an autoclave that pressurizes the encapsulating layer 6 by a static pressure, a heating-mechanically pressurizing device is a pressurizing device that pressurizes the encapsulating layer 6 by a physical contact.

The flat plates 9 are disposed in opposed relation at spaced intervals to each other in an up-down direction. Of the two flat plates 9, the lower-side flat plate 9 is made so that the board 3 is capable of being disposed thereon and the upper-side flat plate 9 is made so as to be in contact with the peeling layer 5 to be capable of being pressurized.

When the mechanically heating-mechanically pressurizing device 10 is used, the encapsulating sheet 4 is sandwiched by the flat plates 9 that have been set to the first temperature in advance by the heater 16, so that the encapsulating sheet 4 is mechanically pressurized.

The first temperature and the heating duration thereof are set so that the compressive elastic modulus at 23° C. of the encapsulating layer 6 after the first heating step is, for example, 1.20 MPa or more, or preferably 1.40 MPa or more. When the compressive elastic modulus is not less than the above-described lower limit, the encapsulating layer 6 in a cured state in which the deformation thereof in the second heating step is capable of being effectively prevented (to be specific, when the encapsulating layer 6 is prepared from a two-step thermosetting resin composition, the encapsulating layer 6 in a B-stage state in which the curing is further progressed from the B-stage state immediately after the encapsulating step) is capable of being surely prepared.

The first temperature is, for example, 80° C. or more, or preferably 100° C. or more, and is, for example, less than 180° C., or preferably less than 160° C.

The first temperature is selected as a fixed temperature (a constant temperature) from the above-described range.

The heating duration at the first temperature is, for example, five minutes or more, or preferably ten minutes or more, and is, for example, two hours or less, preferably one hour or less, or more preferably 45 minutes or less. When the heating duration at the first temperature is not more than the above-described upper limit, the duration in the first heating step is shortened and the production cost of the LED device 1 is capable of being reduced. On the other hand, when the heating duration at the first temperature is not less than the above-described lower limit, the compressive elastic modulus at 23° C. of the encapsulating layer 6 is capable of being set to be within the above-described desired range.

The pressure in the mechanically pressurizing is, for example, 0.1 MPa or more, preferably 0.2 MPa or more, or more preferably 0.3 MPa or more, and is, for example, 2.0 MPa or less, preferably 1.0 MPa or less, or more preferably 0.75 MPa or less. When the pressure is not less than the above-described lower limit, the change of the peeling layer 5 is capable of being effectively suppressed. When the pressure is not more than the above-described upper limit, the damage to the LED 2 is capable of being prevented.

By the first heating step, the curing of the encapsulating layer 6 is further progressed from the B-stage state immediately after the encapsulating step, while the encapsulating layer 6 retains the state before complete curing. Among all, when the encapsulating layer 6 is in a B-stage state, by the first heating step, the curing (to be specific, an addition reaction of a condensation reaction and addition reaction curable type silicone resin composition when the encapsulating layer 6 contains the condensation reaction and addition reaction curable type silicone resin composition) is progressed to some extent, while the encapsulating layer 6 retains the B-stage state.

(Second Heating Step)

In the second heating step, for example, (1) the encapsulating sheet 4 is heated at the second temperature, while, for example, being mechanically pressurized toward the above-described board 3. The above-described mechanically pressurizing device is used in the method (1). Preferably, in view of advantage of reducing the production cost, the second heating step is capable of being performed continuous to the first heating step with the same heating-mechanically pressurizing device (to be specific, the mechanically heating-mechanically pressurizing device 10 or the fluid heating-mechanically pressurizing device 13) as that in the first heating step.

In the second heating step, (2) the encapsulating sheet 4 is also capable of being heated at the second temperature, while being pressurized with an autoclave (a fluid heating-fluid pressurizing device) or the like by a static pressure.

Furthermore, in the second heating step, (3) the encapsulating sheet 4 is also capable of being heated with no load with, for example, a drying oven (a heating oven) or a hot plate without being pressurized, that is, under a normal pressure atmosphere.

Preferably, the above-described method (2) or (3) is used, or more preferably, the method (3) is used.

In the case of the above-described method (2) or (3), in the second heating step, the heating-mechanically pressurizing device illustrated in method (1) for a long duration is not required to be used. Thus, by using a heating-mechanically pressurizing device, a lot of encapsulating sheets 4, the boards 3, and the LEDs 2 are capable of being subjected to the first heating step and simultaneously, a lot of encapsulating sheets 4, the boards 3, and the LEDs 2 are capable of being subjected to the second heating step with a heating device, which is different from the above-described heating-mechanically pressurizing device, that is, the autoclave drying oven in the method (2) or the hot plate in the method (3).

Among all, according to the method (3), a special heating device such as the heating-mechanically pressurizing device illustrated in the method (1) or the autoclave illustrated in the method (2) is not necessary and a lot of encapsulating sheets 4 are capable of being subjected to the second heating step with an easy heating device such as a drying oven or a hot plate.

The pressure in the mechanically pressurizing in the method (1) is the same as that in the first heating step. The pressure in the fluid pressurizing in the method (2) is, for example, 0.1 MPa or more, or preferably 0.2 MPa or more, and is, for example, 1.0 MPa or less, or preferably 0.75 MPa or less. The pressure is capable of being set to be fixed or also to be variable, to be specific, to be increased or reduced.

The second temperature in the second heating step is the temperature at which the encapsulating layer 6 is completely cured. When the encapsulating layer 6 after the first heating step is in a B-stage state, the second temperature is the temperature at which the encapsulating layer 6 is brought into a C-stage state. When the encapsulating layer 6 contains a condensation reaction and addition reaction curable type silicone resin composition, the second temperature is the temperature at which the addition reaction of the condensation reaction and addition reaction curable type silicone resin composition is capable of being substantially terminated (completed). To be specific, the second temperature is, for example, 135° C. or more, or preferably 150° C. or more, and is, for example, 200° C. or less, or preferably 180° C. or less.

The heating duration at the second temperature is, for example, 10 minutes or more, or preferably 30 minutes or more, and is, for example, 20 hours or less, or preferably 10 hours or less.

The encapsulating layer 6 is completely cured by the second heating step. The encapsulating layer 6 that is in a B-stage state in the first heating step is, for example, brought into a C-stage state by the second heating step. When the encapsulating layer 6 contains a condensation reaction and addition reaction curable type silicone resin composition, the addition reaction of the condensation reaction and addition reaction curable type silicone resin composition is substantially terminated (completed).

The encapsulating layer 6 that is cured (completely cured) after the second heating step has a compressive elastic modulus at 23° C. of, for example, above 1.2 MPa, or preferably above 1.4 MPa, and of, for example, 15 MPa or less, or preferably 10 MPa or less.

In this way, as shown in FIG. 2A, the LED device 1 including the board 3, a plurality of the LEDs 2, and the encapsulating sheet 4 is produced.

In the LED device 1, as an encapsulating layer-covered semiconductor element, an encapsulating layer-covered LED 11 that includes the LEDs 2 and the encapsulating layer 6 covering the LEDs 2 is made on the board 3. That is, in the LED device 1, the encapsulating layer-covered LED 11 is mounted on the board 3.

[Peeling Step]

Thereafter, the LED device 1 is taken out from the above-described heating device (in the case of (1), a mechanically pressurizing device and in the case of (2), a fluid heating-fluid pressurizing device); subsequently, the LED device 1 is cooled to a normal temperature; and then, the peeling layer 5 is peeled from the encapsulating layer 6.

[Function and Effect]

According to this method, in the first heating step, the encapsulating sheet 4 is heated at the first temperature that is a relatively low temperature, so that the shape of the encapsulating layer 6 is retained, while the encapsulating layer 6 is in tight contact with the peeling layer 5 and thus, the deformation of the encapsulating layer 6 is capable of being suppressed.

Furthermore, in the first heating step, the encapsulating sheet 4 is mechanically pressurized, so that the deformation of the peeling layer 5 is capable of being prevented. To be specific, the encapsulating sheet 4 is mechanically pressurized, so that the peeling layer 5 is pressurized from the upper side. Thus, for example, floating off of the circumference end portion (both end portions in the right-left direction and both end portions in the front-rear direction float off) and warping such as a case where the peeling layer 5 curves are capable of being prevented. Accordingly, the deformation of the encapsulating layer 6 conforming to the peeling layer 5 is also capable of being prevented.

As a result, in the subsequent second heating step, when the encapsulating sheet 4 is heated at the second temperature that is a relatively high temperature, the encapsulating layer 6 is capable of being surely completely cured, while the shape retention of the encapsulating layer 6 is ensured.

According to this method, when the compressive elastic modulus at 23° C. of the encapsulating layer 6 after the first heating step is 1.20 MPa or more, by the first heating step, the encapsulating layer 6 is capable of being adjusted to be a cured state in which the encapsulating layer 6 is not easily deformed in the second heating step.

In other words, in a case where the compressive elastic modulus at 23° C. of the encapsulating layer 6 after the first heating step is below the above-described lower limit, there may be a case where the deformation along with the curing of the encapsulating layer 6 occurs, when the encapsulating layer 6 is subjected to the second heating step. That is, there may be a case where the encapsulating layer 6 after the first heating step is excessively flexible, so that the above-described deformation of the encapsulating layer 6 in the encapsulating sheet 4 is not capable of being prevented in the second heating step.

On the other hand, in a case where the compressive elastic modulus at 23° C. of the encapsulating layer 6 after the first heating step is not less than the above-described lower limit, the deformation along with the curing of the encapsulating layer 6 is capable of being prevented, when the encapsulating layer 6 is subjected to the second heating step. That is, the encapsulating layer 6 after the first heating step is sufficiently hard, so that the above-described deformation of the encapsulating layer 6 is capable of being prevented in the second heating step.

According to this method, when the encapsulating layer 6 in the encapsulating step is in a B-stage state of the two-step thermosetting resin composition, in the encapsulating step, the shape of the encapsulating layer 6 is capable of being surely retained. Thus, the LEDs 2 are capable of being surely embedded and encapsulated, while the shape of the encapsulating layer 6 is retained.

According to this method, the deformation of the encapsulating layer 6 is prevented and the encapsulating layer 6 that is completely cured is capable of being mounted on the board 3, so that the encapsulating layer-covered LED 11 having excellent reliability and accordingly, the LED device 1 are capable of being produced.

[Modified Example]

In the above-described first embodiment, as shown in FIG. 2C, the peeling layer 5 is peeled after the second heating step. Alternatively, for example, though not shown, the peeling layer 5 can be also peeled between the first heating step and the second heating step, that is, after the first heating step and before the second heating step.

In the above-described first embodiment, a plurality of the LEDs 2 are disposed on the board 3. Alternatively, for example, though not shown, a single piece of the LED 2 can be also disposed on the board 3.

In the above-described first embodiment, the LED 2 that is a light semiconductor element as a semiconductor element in the present invention is described as one example. Alternatively, for example, though not shown, the semiconductor element can also include an electronic element.

The electronic element is a semiconductor element that converts electrical energy to energy other than light, to be specific, to signal energy or the like. To be specific, examples thereof include a transistor and a diode. The size of the electronic element is appropriately selected in accordance with its use and purpose.

In this case, the encapsulating layer 6 contains an encapsulating resin as an essential component and a filler as an optional component. An example of the filler further includes a black pigment such as carbon black. The mixing ratio of the filler with respect to 100 parts by mass of the encapsulating resin is, for example, 5 parts by mass or more, or preferably 10 parts by mass or more, and is, for example, 99 parts by mass or less, or preferably 95 parts by mass or less.

The properties (to be specific, the compressive elastic modulus and the like) of the encapsulating layer 6 are the same as those in the above-described first embodiment.

[First Temperature]

In the above-described first embodiment, the first temperature is set to be a fixed temperature, but the first temperature is not limited to this and the first temperature may have, for example, a temperature range. To be specific, the first temperature may have a temperature rising range in which the temperature rises up to the second temperature.

To be specific, the first temperature has a temperature range of, for example, 20° C. or more, or furthermore, 25° C. or more, and of, less than the second temperature. The temperature rising rate at the first temperature is, for example, 1° C./min or more, or preferably 2° C./min or more, and is, for example, 30° C./min or less, or preferably 20° C./min or less. The temperature rising duration at the first temperature is, for example, 4 minutes or more, or preferably 5 minutes or more, and is, for example, 120 minutes or less, or preferably 60 minutes or less.

When a heating-mechanically pressurizing device is used in the first heating step, for example, the encapsulating sheet 4 is set in the heating-mechanically pressurizing device in which the temperature is a room temperature (around 20 to 25° C.) and subsequently, the temperature of the heater 16 is increased so as to reach the second temperature.

Alternatively, when a heating-mechanically pressurizing device is used in the first heating step, it is also possible to place the encapsulating sheet 4 in a heating-mechanically pressurizing device having the heater 16 that is set at the fixed temperature mentioned in the above-described first embodiment, to be specific, the fixed temperature selected from, for example, a range from 80° C. or more, or preferably 100° C. or more, to, for example, less than 180° C., or preferably less than 160° C.; then maintain the fixed temperature for a predetermined period of time; and thereafter, heat the heater 16 so that the temperature of the heater 16 reaches the second temperature. The duration for which the fixed temperature is maintained is, for example, 3 minutes or more, or preferably 5 minutes or more, and is, for example, 300 minutes or less, or preferably 180 minutes or less. The temperature rising rate is, for example, 1° C./min or more, or preferably 2° C./min or more, and is, for example, 30° C./min or less, or preferably 20° C./min or less. The temperature rising duration is, for example, 1 minute or more, or preferably 2 minutes or more, and is, for example, 120 minutes or less, or preferably 60 minutes or less.

As a result of the first temperature having a temperature rising range in which the temperature rises up to the second temperature, the production efficiency is capable of being improved.

<Second Embodiment>

In the second embodiment, the same reference numerals are provided for members and steps corresponding to each of those in the first embodiment, and their detailed description is omitted.

In the first embodiment, the support of the present invention is described as the board 3. Alternatively, for example, as shown by the phantom lines in FIGS. 1A and 1B, the support of the present invention is also capable of being described as a support sheet 12.

Figure 3A:
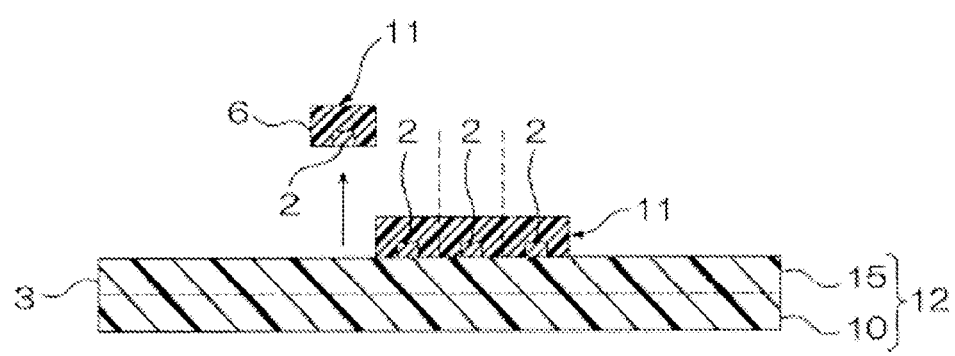
FIGS. 3A and 3B show process drawings for producing a second embodiment of a method for producing a semiconductor device of the present invention.
Figure 3B:
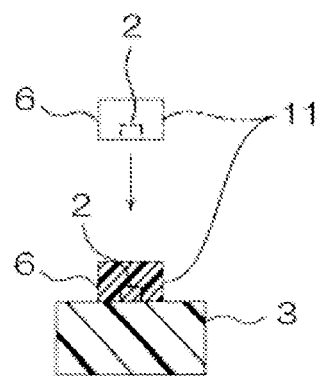

The second embodiment includes a disposing step (ref: FIG. 1A), an encapsulating step (ref: FIG. 1B), a heating step (ref: FIG. 2A), and a mounting step (ref: FIGS. 3A and 3B). Hereinafter, each of the steps is described in detail.

[Disposing Step]

In the disposing step, as shown in FIG. 1A, the LEDs 2 are disposed on the support sheet 12 as a support.

To be specific, first, the support sheet 12 is prepared.

The support sheet 12 is formed into the same plane shape as that of the board 3 in the first embodiment. As shown by the phantom line in FIG. 1A, the support sheet 12 includes a support board 10 and a pressure-sensitive adhesive layer 15 that is laminated on the upper surface of the support board 10.

The support board 10 is formed into a plate shape extending in the plane direction. The support board 10 is provided in the lower portion in the support sheet 12 and is formed into the generally same shape in plane view as that of the support sheet 12. The support board 10 is made of a hard material that is incapable of stretching in the plane direction. To be specific, examples of the material include silicon oxide (silica or the like), oxide such as alumina, metal such as stainless steel, and silicon. The support board 10 has a Young's modulus at 23° C. of, for example, $10^6$ Pa or more, preferably $10^7$ Pa or more, or more preferably $10^8$ Pa or more, and of, for example, $10^{12}$ Pa or less. When the Young's modulus of the support board 10 is not less than the above-described lower limit, the hardness of the support board 10 is secured and the LEDs 2 are capable of being further more surely supported. The Young's modulus of the support board 10 is obtained from the compressive elastic modulus or the like of JIS H 7902:2008. The support board 10 has a thickness of, for example, 0.1 mm or more, or preferably 0.3 mm or more, and of, for example, 5 mm or less, or preferably 2 mm or less.

The pressure-sensitive adhesive layer 15 is formed on the entire upper surface of the support board 10. An example of a pressure-sensitive adhesive material that forms the pressure-sensitive adhesive layer 15 includes a pressure-sensitive adhesive such as an acrylic pressure-sensitive adhesive and a silicone pressure-sensitive adhesive. The pressure-sensitive adhesive layer 15 can be also formed of an active energy ray irradiation peeling sheet or the like (to be specific, an active energy ray irradiation peeling sheet described in Japanese Unexamined Patent Publication No. 2005-286003 or the like) in which the pressure-sensitive adhesive force is reduced by application of an active energy ray. The pressure-sensitive adhesive layer 15 has a thickness of, for example, 0.1 mm or more, or preferably 0.2 mm or more, and of, for example, 1 mm or less, or preferably 0.5 mm or less.

In order to prepare the support sheet 12, for example, the support board 10 is attached to the pressure-sensitive adhesive layer 15. Also, the pressure-sensitive adhesive layer 15 can be directly laminated on the support board 10 by the following application method or the like. In the method, first, the support board 10 is prepared; next, a varnish that is prepared from the above-described pressure-sensitive adhesive material and a solvent blended as required is applied to the support board 10; and thereafter, the solvent is distilled off as required.

The support sheet 12 has a thickness of, for example, 0.2 mm or more, or preferably 0.5 mm or more, and of, for example, 6 mm or less, or preferably 2.5 mm or less.

Next, a plurality of the LEDs 2 are laminated on the support sheet 12. To be specific, the lower surface of each of the LEDs 2 is brought into contact with the upper surface of the pressure-sensitive adhesive layer 15.

In this way, a plurality of the LEDs 2 are disposed on the support sheet 12.

[Encapsulating Step]

In the encapsulating step, as shown in FIG. 1A, first, the encapsulating sheet 4 is prepared. Thereafter, as shown in FIG. 1B, the LEDs 2 are encapsulated by the encapsulating sheet 4 in the same manner as that in the first embodiment.

[Heating Step]

As shown in FIG. 2A, the encapsulating sheet 4 is heated in the same manner as that in the first embodiment (a two-step heating step).

The upper limit values of the first temperature and the second temperature in the first heating step are set in view of heat resistance of the support sheet 12.

By the heating step, the encapsulating layer-covered LED 11 in which a plurality of the LEDs 2 are covered with the encapsulating layer 6 is obtained on the support sheet 12.

Thereafter, as shown in FIG. 2B, the peeling layer 5 is peeled from the encapsulating sheet 4 (a peeling step).

[Mounting Step]

In the mounting step, first, as shown by a dashed line in FIG. 3A, the encapsulating layer 6 is cut corresponding to each of the LEDs 2. To be specific, the encapsulating layer 6 is cut along the thickness direction. Subsequently, the encapsulating layer-covered LED 11 is peeled from the upper surface of the pressure-sensitive adhesive layer 15 (an LED peeling step). To be specific, when the pressure-sensitive adhesive layer 15 is an active energy ray irradiation peeling sheet, an active energy ray is applied to the pressure-sensitive adhesive layer 15. In this way, the encapsulating layer-covered LEDs 11 are singulated corresponding to each of the LEDs 2.

Thereafter, after the singulated encapsulating layer-covered LED 11 is selected in accordance with emission wavelength and luminous efficiency, as shown in FIG. 3B, the encapsulating layer-covered LED 11 is mounted on the board 3. To be specific, a terminal provided on the lower surface of the LED 2 is connected to an electrode in the board 3 and the encapsulating layer-covered LED 11 is flip-chip mounted on the board 3.

In this way, the LED device 1 including the board 3, a single piece of the LED 2, and the encapsulating sheet 4 is produced.

[Function and Effect]

In this method, the encapsulating layer-covered LED 11 including the encapsulating layer 6 that is completely cured and in which the deformation thereof is prevented is capable of being mounted on the board 3, so that the LED device 1 having excellent reliability is capable of being produced.

Among all, in the second embodiment, the LEDs 2 are disposed on the support sheet 12 (ref: the phantom line in FIG. 1A) and the LEDs 2 are supported by the support sheet 12 with a smaller supporting force than that of the LEDs 2 with respect to the board 3 in the first embodiment (ref: the solid line in FIG. 1A). Thus, the LED 2 in the second embodiment is easily shifted (displaced) in the plane direction with respect to the LED 2 in the first embodiment.

In the second embodiment, however, in the first heating step, the encapsulating sheet 4 is heated at the first temperature that is a relatively low temperature and is mechanically pressurized, so that the displacement (chip shift) of the LED 2 is capable of being prevented.

<Third Embodiment>

In the third embodiment, the same reference numerals are provided for members and steps corresponding to each of those in the first embodiment, and their detailed description is omitted.

In the first embodiment shown in FIG. 1A, the board 3 is formed into a flat plate shape. Alternatively, for example, as shown in FIG. 4A, a concave portion 7 can be also formed in the board 3.

The third embodiment includes a disposing step (ref: FIG. 4A), an encapsulating step (ref: FIGS. 4B and 4C), and a heating step (ref: FIG. 5A). Hereinafter, each of the steps is described in detail.

[Disposing Step]

Figure 4A:
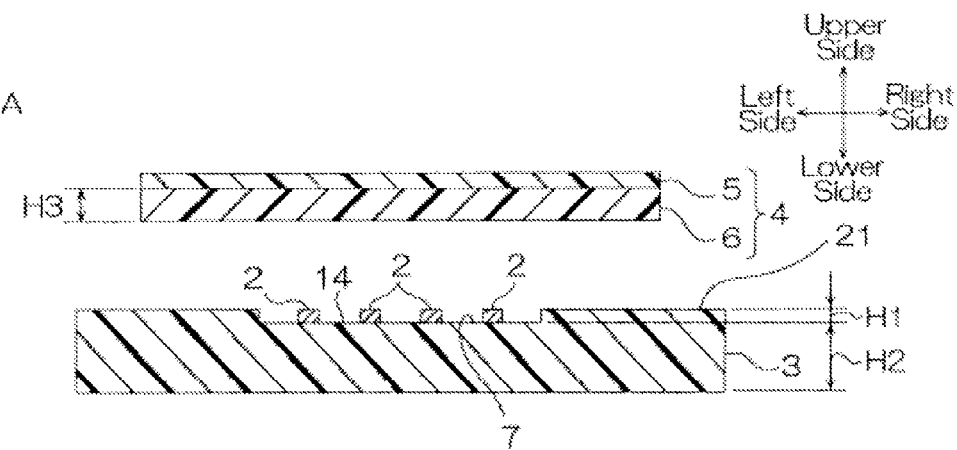
FIGS. 4A, 4B and 4C show process drawings for producing a third embodiment of a method for producing a semiconductor device of the present invention.
Figure 4B:
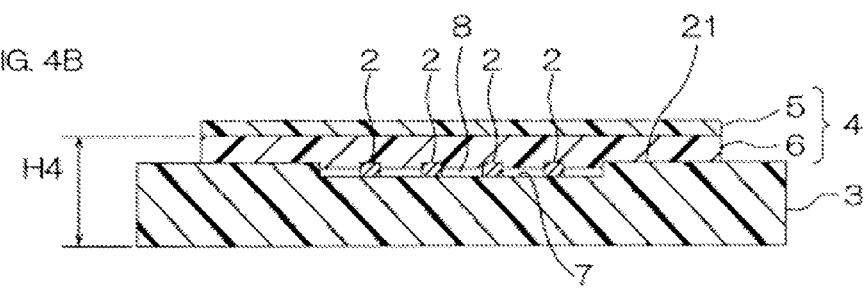
Figure 4C:
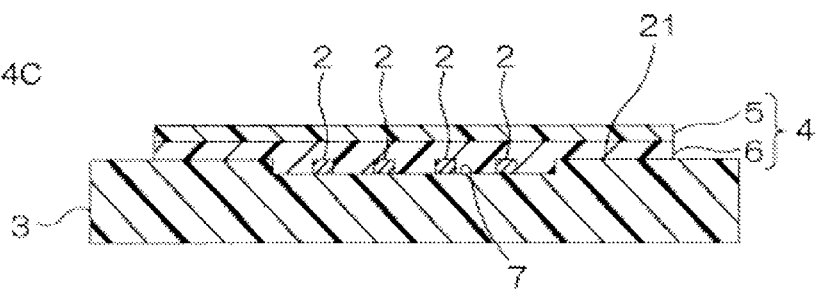
Figure 5A:
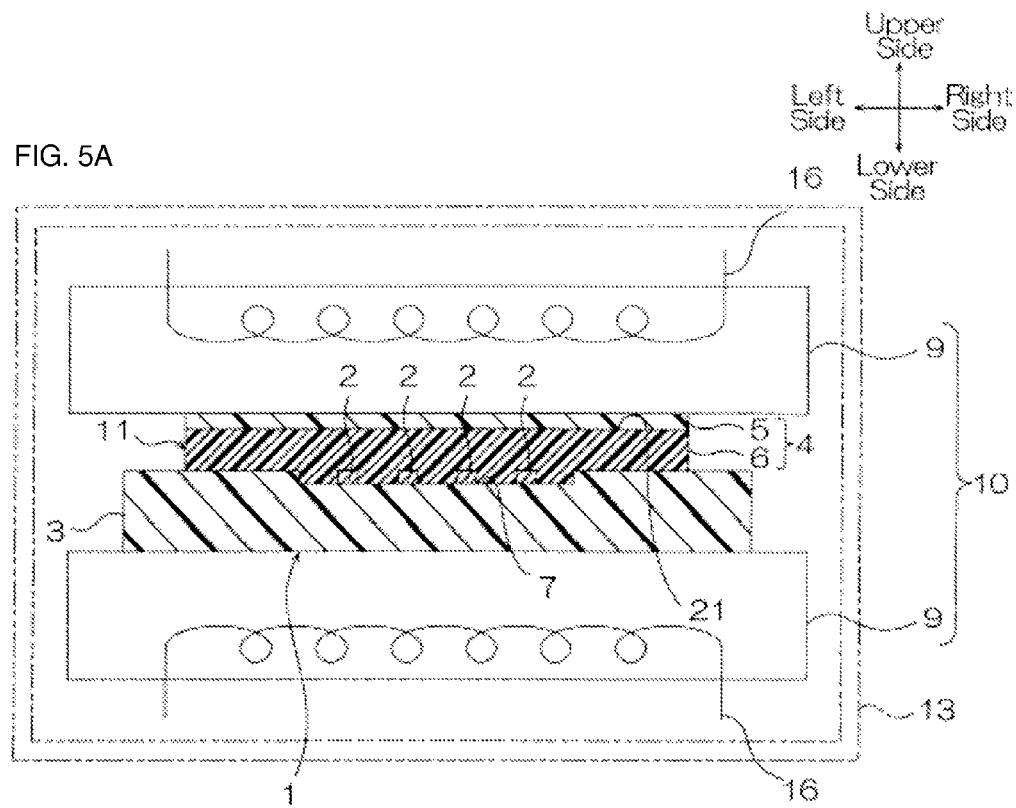
FIGS. 5A and 5B show process drawings for producing a third embodiment of a method for producing a semiconductor device of the present invention.

As shown in FIG. 4A, the concave portion 7 is formed so as to dent downwardly in a rectangular shape in plane view in the upper surface of the board 3 and is surrounded by a portion other than the concave portion 7 (the circumference) of the board 3 around the concave portion 7 in all directions (the front-rear and the right-left directions) without any space.

The concave portion 7 has a length of one side of, for example, 0.8 mm or more, or preferably 1 mm or more, and of, for example, 300 mm or less, or preferably 100 mm or less.

The concave portion 7 has a depth H1 (a length, in the up-down direction, between the upper surface of a portion around the concave portion 7 (hereinafter, referred to as a circumferential upper surface 21) and the upper surface of the concave portion 7 (hereinafter, referred to as a concave upper surface 14)) of, for example, 1000 μm or less, preferably 500 μm or less, more preferably 200 μm or less, or particularly preferably 170 μm or less, and of, for example, 10 μm or more, or preferably 50 μm or more.

The depth H1 of the concave portion 7 with respect to a thickness H2 of the board 3 is, for example, 90% or less, or preferably 80% or less, and is, for example, 10% or more, or preferably 20% or more.

A plurality of the LEDs 4 are disposed in the concave portion 7. The thickness of the LED 2 with respect to the depth H1 of the concave portion 7 is, for example, 90% or less, or preferably 80% or less.

[Encapsulating Step]

The encapsulating step includes a pressure-welding step (ref: FIG. 4B) and a pressure exposed step (ref: FIG. 4C).

(Pressure-Welding Step)

In the pressure-welding step, first, the encapsulating sheet 4 is prepared. As shown in FIG. 4A, a thickness H3 of the encapsulating layer 6 with respect to the depth H1 of the concave portion 7 is, for example, 50% or more, preferably 80% or more, or more preferably 100% or more, and is, for example, 900% or less, preferably 700% or less, or more preferably 400% or less.

In the pressure-welding step, next, the prepared encapsulating sheet 4 is disposed in opposed relation at spaced intervals to the upper side of the board 3 and then, is put into a vacuum chamber such as a vacuum pressing machine.

Next, the pressure in the vacuum chamber is reduced. To be specific, the pressure in the vacuum chamber is evacuated with a vacuum pump (a pressure-reducing pump) or the like.

As shown in FIG. 4B, the inside of the vacuum chamber is brought into a reduced pressure atmosphere and the encapsulating layer 6 in the encapsulating sheet 4 is pressure-welded to the board 3 with a pressing machine of the vacuum pressing machine or the like.

The reduced pressure atmosphere in the pressure-welding step is, for example, 300 Pa or less, preferably 100 Pa or less, or particularly preferably 50 Pa or less.

In the pressure-welding in the pressure-welding step, the amount (hereinafter, defined as a pushed-in amount) in which the encapsulating layer 6 is pushed into (pressure-welded to) the side of the board 3 (the lower side) is controlled.

By controlling the pushed-in amount, the lower surface of the encapsulating layer 6 is adjusted so as to be in tight contact with the circumferential upper surface 21 and to be separated from the concave upper surface 14.

To be specific, the encapsulating layer 6 is adjusted so that the pushed-in amount shown in the following formula is minus and the absolute value of the pushed-in amount is smaller than the depth H1 of the concave portion 7.

Pushed-in amount=(height H2 of the concave upper surface 14 with the bottom surface of the board 3 as a reference+ thickness H3 of the encapsulating layer 6 before the pressure-welding step)−height H4 of the upper surface of the encapsulating layer 6 with the bottom surface of the board 3 after the pressure-welding step as a reference When the pushed-in amount is plus, the encapsulating layer 6 is excessively pressed to such a degree that the thickness (H4−H2) of the encapsulating layer 6 after the pressure-welding step becomes thinner than the thickness H3 of the encapsulating layer 6 before the pressure-welding step. In this way, the encapsulating layer 6 is brought into tight contact with the concave upper surface 14. In contrast, when the pushed-in amount is minus, the encapsulating layer 6 is adjusted so as to be separated from the concave upper surface 14.

When the absolute value of the pushed-in amount is larger than the depth H1 of the concave portion 7, the lower surface of the encapsulating layer 6 is not brought into tight contact with the circumferential upper surface 21 and the concave portion 7 is not capable of being confined by the encapsulating layer 6. In contrast, when the absolute value of the pushed-in amount is smaller than the depth H1 of the concave portion 7, the encapsulating layer 6 is adjusted so as to be brought into tight contact with the circumferential upper surface 21.

The absolute value of the pushed-in amount (H2+H3−H4) with respect to the depth H1 of the concave portion 7 is, for example, less than 100%, or preferably 95% or less, and is, for example, above 0%, or preferably 10% or more.

The temperature in the pressure-welding step is, for example, 0° C. or more, or preferably 15° C. or more, and is, for example, 60° C. or less, or preferably 35° C. or less.

In the pressure-welding step, the encapsulating sheet 4 is retained in a state of being pushed down (pushed in) as required.

The duration of retention is, for example, 5 seconds or more, or preferably 10 seconds or more, and is, for example, 10 minutes or less, or preferably 5 minutes or less.

As shown in FIG. 4B, by the pressure-welding step, a reduced-pressure space 8 that is, in the concave portion 7, defined by the board 3 and the encapsulating layer 6 and is sealed is formed.

The pressure-welding step is performed at, for example, the same temperature as that in the encapsulating step in the first embodiment or preferably at a normal temperature.

(Pressure Exposed Step)

As shown in FIG. 4C, the pressure exposed step is a step of exposing the board 3 and the encapsulating sheet 4 to an atmospheric pressure atmosphere.

After the pressure-welding step, by the pressure exposed step, the encapsulating layer 6 is brought into tight contact with the concave portion 7 so as to conform to the shape thereof.

To be specific, the operation of the vacuum pump is stopped and the pressure in the vacuum chamber is exposed. Then, by a differential pressure between a pressure in the reduced-pressure space 8 and the atmospheric pressure, the upper surface of the encapsulating layer 6 is pressed downwardly and the lower surface of the encapsulating layer 6 is deformed so as to conform to the shape of the concave portion 7 to be brought into tight contact with the upper surface of the concave portion 7.

By the pressure exposed step, the encapsulating layer 6 encapsulates the LEDs 4 so as to be in tight contact with the concave portion 7.

[Heating Step]

As shown in FIG. 5A, the two-step heating step is performed in the same manner as that in the first embodiment.

Figure 5B:
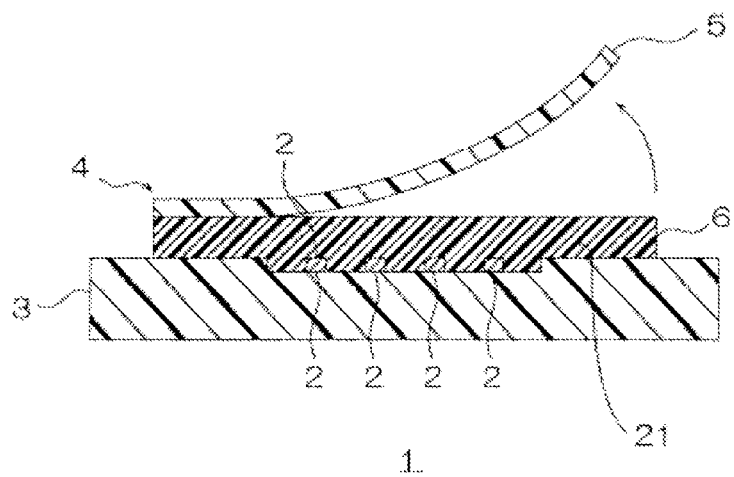

Thereafter, as shown in FIG. 5B, the peeling layer 5 is peeled from the encapsulating layer 6.

In this way, the LED device 1 is obtained.

[Function and Effect]

According to the method for producing the LED device 1, in the pressure-welding step, the encapsulating layer 6 is pressure-welded so as to be separated from the concave upper surface 14. Thus, when a member around the LEDs 2, to be specific, the LEDs 2 are wire-bonding connected to the board 3, the stress of the encapsulating layer 6 with respect to a wire at the time of being pressure-welded thereto is capable of being reduced.

On the other hand, in the pressure-welding step, the encapsulating layer 6 confines the circumferential upper surface 21 under a reduced pressure atmosphere, so that the reduced-pressure space 8 that is, in the concave portion 7, defined by the board 3 and the encapsulating layer 6 and is sealed is formed.

Thus, in the pressure exposed step, when the atmospheric pressure is exposed, the encapsulating layer 6 fills the concave portion 7 without any space by a differential pressure between a pressure in the reduced-pressure space 8 and the atmospheric pressure. Thus, generation of a void between the board 3 and the encapsulating layer 6 is capable of being suppressed.

As a result, when the LEDs 2 are wire-bonding connected to the board 3, the deformation of the wire (not shown) is capable of being reduced and the generation of the void is capable of being suppressed.

EXAMPLES

Values in Examples and the like shown in the following can be replaced with the values (that is, the upper limit value or the lower limit value) described in the above-described embodiment.

Example 1

[Disposing Step]
A plurality of LEDs were disposed on a board. Each of the LEDs had a thickness of 330 μm and the gap between the LEDs was 1.5 mm

[Encapsulating Step]
An encapsulating sheet was prepared.
To be specific, 20 g (1.4 mmol of a vinylsilyl group) of a dimethylvinylsilyl-terminated polydimethylsiloxane (a vinylsilyl group equivalent of 0.071 mmol/g); 0.40 g (1.6 mmol of a hydrosilyl group) of a trimethylsilyl-terminated dimethylsiloxane-methylhydrosiloxane copolymer (a hydrosilyl group equivalent of 4.1 mmol/g); 0.036 mL (1.9 μmol) of a xylene solution (a platinum concentration of 2 mass %) of a platinum-divinyltetramethyldisiloxane complex (a hydrosilylation catalyst); and 0.063 mL (57 μmol) of a methanol solution (10 mass %) of a tetramethylammonium hydroxide (TMAH, a curing retarder) were mixed to be stirred at 20° C. for 10 minutes and then, 30 parts by mass of silicone microparticles (Tospearl 2000B, manufactured by Momentive Performance Materials Inc.) were blended with respect to 100 parts by mass of the obtained mixture to be uniformly stirred and mixed, so that a two-step curable type silicone resin composition was obtained.

Subsequently, the two-step curable type silicone resin composition was applied onto a peeling layer (a thickness of 50 μm, a linear expansion coefficient: $90 \times 10^{-6} K^{-1}$) made of a PET film that was subjected to a release treatment and a coated film was prepared.

Next, the coated film was heated at 135° C. for 15 minutes, so that an encapsulating layer that was made of a two-step curable type silicone resin composition in a semi-cured state (in a B-stage state) and had a thickness of 1000 μm was fabricated. In this way, an encapsulating sheet including the peeling layer and the encapsulating layer was fabricated (ref: FIG. 1A).

[Encapsulating Step]
The board mounted with the LEDs and the encapsulating layer in the encapsulating sheet were disposed in opposed relation to each other in the thickness direction. The resulting laminate was put into a vacuum chamber of a vacuum pressing machine (model number: CV200, manufactured by Nichigo-Morton Co., Ltd.).

The pressure in the vacuum chamber was evacuated with a vacuum pump (a pressure-reducing pump) (model number: E2M80, manufactured by Edwards Japan Limited) and the pressure in the vacuum chamber was reduced to be 50 Pa at a normal temperature.

The board and the encapsulating sheet were pressure-welded to each other under a reduced pressure atmosphere with a vacuum pressing machine to be retained at 20° C. for 3 minutes. Thereafter, the vacuum pump was stopped and the pressure in the vacuum chamber was exposed.

In this way, the LEDs were encapsulated by the encapsulating layer (ref: FIG. 1B).

[Heating Step]
(First Heating Step)
The board mounted with the LEDs that were encapsulated by the encapsulating layer was set in a hot pressing device including flat plates each mounted with a heater. The temperature of the heater was set to be 135° C. (a first temperature) in advance and the encapsulating sheet was mechanically pressurized downwardly by the flat plates at a pressure of 0.5 MPa for 10 minutes and the encapsulating sheet was heated.

(Second Heating Step)
Thereafter, the encapsulating sheet and the board were taken out from the hot pressing device and next, the encapsulating sheet and the board were put in a drying oven. To be specific, the temperature of the drying oven was set to be 150° C. (a second temperature) in advance and the encapsulating sheet was heated for two hours. In this way, the encapsulating layer was brought into a C-stage state, that is, was completely cured.

In this way, an LED device including the board, a plurality of the LEDs, and the encapsulating sheet was produced. Thereafter, the LED device was taken out from the mechanically pressurizing device to be cooled and thereafter, the peeling layer was peeled from the encapsulating layer.

Example 2

An LED device was produced in the same manner as that in Example 1, except that the heating duration (a mechanically pressurizing duration) in the first heating step was changed from 10 minutes to 20 minutes.

Example 3

An LED device was produced in the same manner as that in Example 1, except that the heating duration (a mechanically pressurizing duration) in the first heating step was changed from 10 minutes to 60 minutes.

Example 4

An LED device was produced in the same manner as that in Example 1, except that the heating duration (a mechanically pressurizing duration) in the first heating step was changed from 10 minutes to 5 minutes.

Comparative Example 1

An LED device was produced in the same manner as that in Example 1, except that in the heating step, a one-step heating step at 150° C. was performed and the one-step heating step was performed at a normal pressure instead of the two-step heating step. To be specific, the encapsulating sheet was heated with no load by using a drying oven, setting the temperature of the drying oven to be 150° C. in advance, and setting the heating duration to be two hours and 10 minutes (130 minutes).

Comparative Example 2

An LED device was produced in the same manner as that in Example 1, except that in the heating step, a one-step heating step at 135° C. was performed and the one-step heating step was performed at a normal pressure instead of the two-step heating step. To be specific, the encapsulating sheet was heated with no load by using a drying oven, setting the temperature of the drying oven to be 135° C. in advance, and setting the heating duration to be two hours and 10 minutes (130 minutes).

(Evaluation)
(Compressive Elastic Modulus)

The compressive elastic modulus at 23° C. of each of the encapsulating layers after the encapsulating step, after the first heating step, and after the second heating step in Examples and Comparative Examples was measured. The compressive elastic modulus was measured in conformity with the description in JIS H 7902:2008.

(Deformation of Encapsulating Layer and Peeling Layer)

A presence or absence of warping in each of the encapsulating layers and the peeling layers in the obtained LED devices in Examples and Comparative Examples was visually observed. The results are shown in Table 1.

(Cured State of Encapsulating Layer)

The cured state of each of the encapsulating layers in the obtained LED devices in Examples and Comparative Examples was evaluated by the compressive elastic modulus.

TABLE 1

| | | | Ex. 1 | Ex. 2 | Ex. 3 | Ex. 4 | Comp. Ex. 1 | Comp. Ex. 2 |
|---|---|---|---|---|---|---|---|---|
| Encapsulating Layer | Compressive Elastic Modulus (at 25° C.) [MPa] | After Encapsulating Step | 0.1 | 0.1 | 0.1 | 0.1 | 0.1 | 0.1 |
| | | After First Heating Step | 1.25 | 1.50 | 1.60 | 0.20 | 1.6 | 1.6 |
| | | After Second Heating Step | 1.6 | 1.6 | 1.6 | 1.6 | | |
| | Deformation | | Absence of Warping | Absence of Warping | Absence of Warping | Slight Warping | Large Warping | Large Warping |
| Peeling Layer | Deformation | | Absence | Absence | Absence | Absence | Absence | Absence |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

Industrial Applicability

The encapsulating layer-covered semiconductor element and the semiconductor device obtained by a method for producing an encapsulating layer-covered semiconductor element and a method for producing a semiconductor device are used in various semiconductor uses.

The invention claimed is:

1. A method for producing an encapsulating layer-covered semiconductor element comprising:
a disposing step of disposing a semiconductor element on a support,
an encapsulating step of embedding and encapsulating the semiconductor element by an encapsulating layer in an encapsulating sheet including a peeling layer and the encapsulating layer laminated below the peeling layer and made from a thermosetting resin before complete curing, and
a heating step of heating and curing the encapsulating layer after the encapsulating step, wherein
the heating step includes
a first heating step in which the encapsulating sheet is heated at a first temperature, while being mechanically pressurized toward the support and
a second heating step in which the encapsulating sheet is heated at a second temperature that is higher than the first temperature after the first heating step.

2. The method for producing an encapsulating layer-covered semiconductor element according to claim 1, wherein the encapsulating layer after the first heating step has a compressive elastic modulus at 23° C. of 1.20 MPa or more.

3. The method for producing an encapsulating layer-covered semiconductor element according to claim 1, wherein the encapsulating layer in the encapsulating step is in a B-stage state of a two-step thermosetting resin composition.

4. The method for producing an encapsulating layer-covered semiconductor element according to claim 1, wherein the first temperature has a temperature rising range in which the temperature rises up to the second temperature.

5. The method for producing an encapsulating layer-covered semiconductor element according to claim 1, wherein the support is a board and
in the disposing step, the semiconductor element is mounted on the board.

6. A method for producing a semiconductor device comprising the steps of:
producing an encapsulating layer-covered semiconductor element and
mounting the encapsulating layer-covered semiconductor element on a board, wherein
the encapsulating layer-covered semiconductor element is produced by a method for producing a semiconductor device, wherein
the method for producing an encapsulating layer-covered semiconductor element comprises:
a disposing step of disposing a semiconductor element on a support, an encapsulating step of embedding and encapsulating the semiconductor element by an encapsulating layer in an encapsulating sheet including a peeling layer and the encapsulating layer laminated below the peeling layer and made from a thermosetting resin before complete curing, and a heating step of heating and curing the encapsulating layer after the encapsulating step, and the heating step includes a first heating step in which the encapsulating sheet is heated at a first temperature, while being mechanically pressurized toward the support and a second heating step in which the encapsulating sheet is heated at a second temperature that is higher than the first temperature after the first heating step.

* * * * *